(12) United States Patent
Fiedler

(10) Patent No.: US 7,285,996 B2
(45) Date of Patent: Oct. 23, 2007

(54) DELAY-LOCKED LOOP

(75) Inventor: Alan Fiedler, Niskayuna, NY (US)

(73) Assignee: SLT Logic, LLC, Boston, MA (US)

( * ) Notice: Subject to any disclaimer, the term of this patent is extended or adjusted under 35 U.S.C. 154(b) by 23 days.

(21) Appl. No.: 11/241,230

(22) Filed: Sep. 30, 2005

(65) Prior Publication Data

US 2007/0075758 A1 Apr. 5, 2007

(51) Int. Cl.
*H03L 7/06* (2006.01)
(52) U.S. Cl. .................... 327/158; 327/161
(58) Field of Classification Search .............. None
See application file for complete search history.

(56) References Cited

U.S. PATENT DOCUMENTS

| | | | |
|---|---|---|---|
| 6,380,783 B1 | 4/2002 | Chao et al. | |
| 6,411,145 B1* | 6/2002 | Kueng et al. | 327/175 |
| 6,469,555 B1 | 10/2002 | Lau et al. | |
| 6,642,760 B1* | 11/2003 | Alon et al. | 327/158 |
| 6,690,214 B2* | 2/2004 | Miyano | 327/149 |
| 6,731,148 B2 | 5/2004 | Lau et al. | |
| 6,774,693 B2 | 8/2004 | Carr | |
| 6,775,342 B1* | 8/2004 | Young et al. | 375/371 |
| 6,844,766 B2* | 1/2005 | Sun | 327/284 |
| 6,917,660 B2 | 7/2005 | Song | |
| 6,950,487 B2* | 9/2005 | Lin et al. | 375/376 |
| 6,954,095 B2 | 10/2005 | Lau et al. | |
| 7,009,434 B2* | 3/2006 | Lee | 327/158 |
| 7,138,845 B2* | 11/2006 | Lin | 327/277 |
| 7,154,978 B2* | 12/2006 | Juan et al. | 375/376 |
| 2003/0002607 A1 | 1/2003 | Mooney et al. | |
| 2004/0095174 A1* | 5/2004 | Hong et al. | 327/175 |
| 2004/0174195 A1 | 9/2004 | Lau et al. | |
| 2004/0223571 A1 | 11/2004 | Donnelly et al. | |

* cited by examiner

*Primary Examiner*—Cassandra Cox
(74) *Attorney, Agent, or Firm*—Patterson, Thuente, Skaar & Christensen, P.A.

(57) ABSTRACT

A delay locked loop (DLL) circuit that includes a delay line having a plurality of delay elements. Each delay element can be adapted to receive a clock input signal and generate a clock output signal, where the phase of each clock output signal is offset from the clock input signal. The delay line can be configured so that one clock input signal is a reference input clock signal and at least one clock output signal is a delay-line output clock signal. The feedback portion of the circuit can be configured to generate delay adjust signals based upon the phase offsets between pairs of clock signals. The delay adjust signals are fed back to the delay elements causing the reference input clock signal and the clock output signals to be phase-shifted apart equally about 360 degrees.

9 Claims, 19 Drawing Sheets

DELAY LINE A

DELAY ELEMENT

ALTERNATIVE DELAY ELEMENT

Feedback Circuit A

RESET CIRCUIT

FALSE LOCK CONDITION

DUTY CYCLE MONITOR

Feedback Circuit C

DELAY-LOCKED LOOP

FIELD OF THE INVENTION

The present invention generally relates to integrated circuits for high-speed data applications, and more particularly to a delay-locked loop having accurate clock phase multiplication, and systems and methods employing such a delay-locked loop.

BACKGROUND OF THE INVENTION

A delay-locked loop is capable of generating multiple clock phase outputs from a clock signal input. It is desirable to have a delay-locked loop which has reduced circuit component matching requirements while generating multiple clock outputs equally spaced about 360 degrees.

Prior art inventions disclose delay locked loops that utilize chains of delay elements and relatively complex control schemes to generate a set of clock signals. The delay-locked loop of U.S. Patent Publication No. 2004-0223571 receives an input clock signal, then generates a single delay adjust signal by means of a phase detector, and control circuitry. The single delay adjust signal then controls the delay time of all of the delay elements in the chain. At a minimum, the control circuitry of this application includes a counter control circuit with digital memory, and a digital-to-analog converter. The set of generated clock signals is then further processed by additional circuitry that includes a phase interpolator, selection circuitry, and other feedback controls.

It would be desirable to provide a delay lock loop that improved on existing designs and is better suited for high speed data applications.

SUMMARY OF THE INVENTION

The present invention provides a delay-locked loop which generates multiple clock phases equally spaced about 360 degrees. The phase of each generated clock is individually measured and adjusted, and this reduces circuit matching requirements of certain parts of the clock-generation circuit. In one embodiment, the delay-locked loop comprises a delay line which generates multiple clock phase outputs equally spaced about 360 degrees, and a feedback loop including a feedback circuit which measures the multiple clock phase outputs and provides an adjusted control output signal for each clock phase to the delay line such that the multiple clock phase outputs are equally spaced about 360 degrees.

In another embodiment, the present invention provides multiple delay locked loops coupled together to achieve clock phase multiplication where the spacing between generated clock phases is less than the delay through a single delay element in a delay-locked loop. In this embodiment the multiple delay-locked loops generate multiple clock phase outputs equally spaced about 360 degrees, where the spacing between generated clock phases is less than the delay through a single delay element in a delay-locked loop. The system may also include a delay line which generates multiple clock phase outputs equally spaced about 360 degrees, a feedback loop including a feedback circuit which measures the multiple clock phase outputs and provides an adjusted control output signal for each clock phase to the delay line such that the multiple clock phase outputs are equally spaced about 360 degrees, and a second delay-locked loop coupled to the first delay-locked loop such that the rising edges of its clock phases lie exactly between the rising edges of the first delay-locked loop's clock phases.

In a third embodiment, the present invention provides a delay-locked loop and a time division multiplexer, where a portion of the multiplexer itself is embedded within the control loop of the delay-locked loop. In this embodiment, the invention is a multiplexer system comprising a delay-locked loop similar to the delay locked loops of the first and second embodiments, and a time-division multiplexer, where a portion of the multiplexer is embedded within the control loop of the delay-locked loop.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be used and structural or logical changes may be made without departing from the scope of the present invention. The following detailed description, therefore, is not to be taken in a limiting sense.

Figure 1:
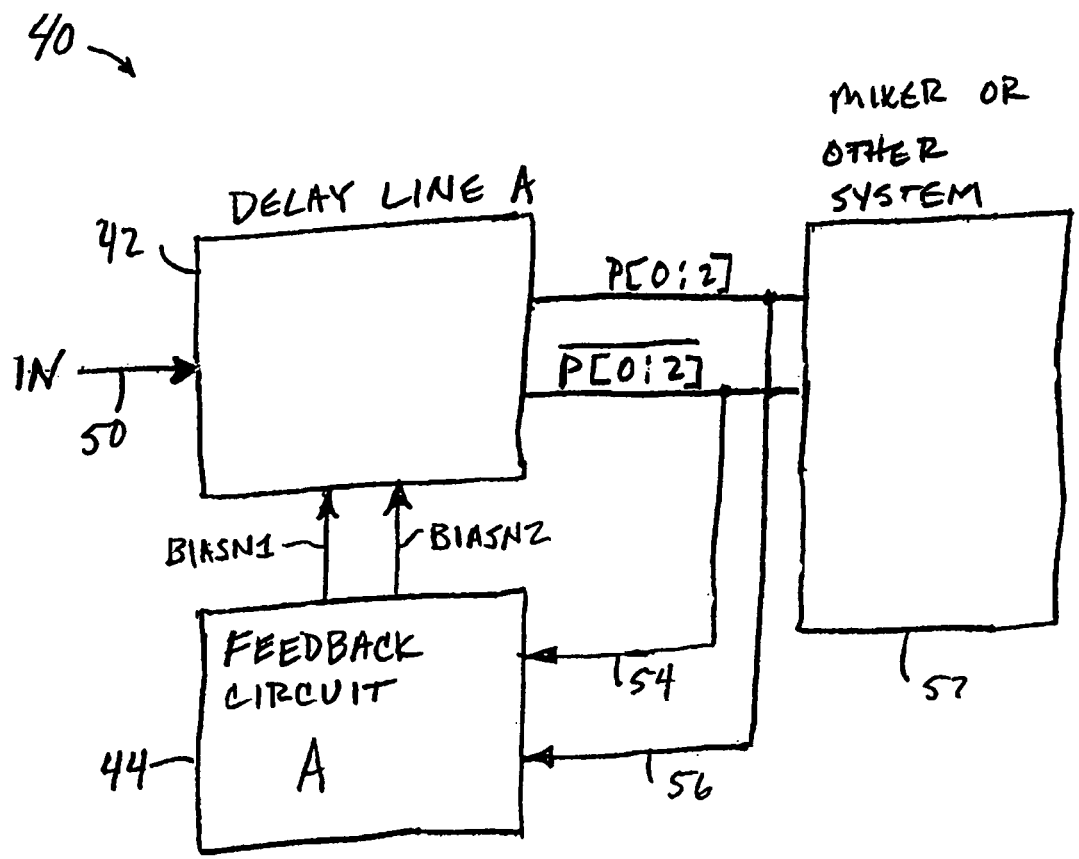
FIG. 1 is a diagram illustrating one exemplary embodiment of a delay locked loop according to the present invention.

FIG. 1 is a diagram illustrating one exemplary embodiment of a delay-locked loop according to the present invention. The delay-locked loop generates multiple clock phases equally spaced about 360°. The phase of each generated clock is individually measured and adjusted, reducing clock-generation circuit matching requirements. The delay-locked loop 40 includes a delay line 42 and a feedback circuit 44. In operation, delay line 42 receives a clock signal input 50. Delay-line 42 provides multiple clock phase outputs P[0:2] and P[0:2] to a high speed data application, such as a mixer or other system 52 (e.g., a high-speed serializer or deserializer). The multiple clock phases P[0:2] and P[0:2] are measured by feedback control circuit 44 as part of a feedback control loop, indicated at 54, 56. Feedback control circuit 44 provides feedback control signals BIASN1 and BIASN2 such that the rising edge of clock phases P[0:2] are evenly distributed about 360°.

Figure 2:
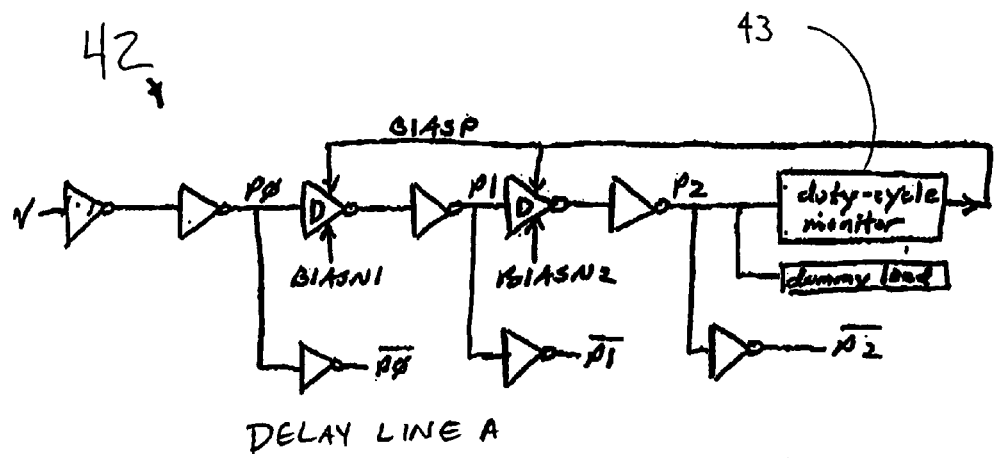
FIG. 2 is a diagram illustrating one exemplary embodiment of a delay line used in a delay-locked loop according to the present invention.
Figure 3:
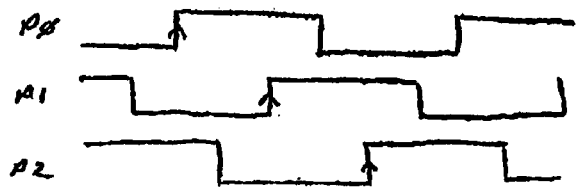
FIG. 3 is a timing diagram.

FIG. 2 illustrates one exemplary embodiment of delay line 42 suitable for use in a delay-locked loop according to the present invention. The delay-locked loop 40 provides accurate clock phase multiplication, where the multiple clock phases output from the delay line 42 are equally spaced about 360 degrees. BIASNI and BIASN2 are controlled such that the rising edge of clock phases P[0:2] are evenly distributed about 360°, illustrated in FIG. 3.

The "duty-cycle monitor" 43 controls BIASP such that the duty cycle at P2 (and, by extension, at P0 and PI) is substantially equal to 50%. Other circuits, some not based on a duty-cycle measurement, can also be used to generate BIASP. Dynamic duty-cycle control is generally not as important when a larger number of clock phases (N=8 or larger, for example) are generated by the delay-locked loop 40.

Figure 4:
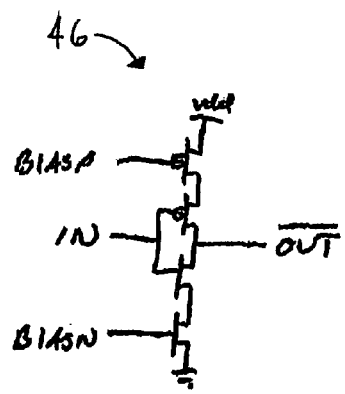
FIG. 4 is a diagram illustrating one exemplary embodiment of a delay circuit used in a delay-locked loop according to the present invention.
Figure 5:
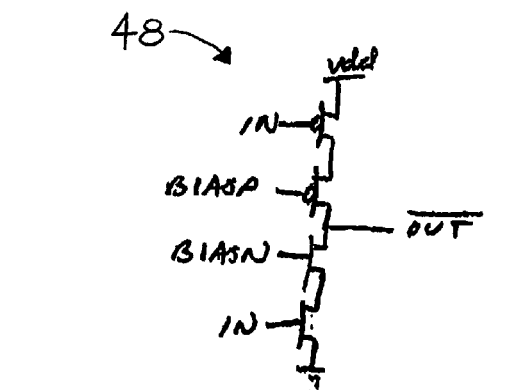
FIG. 5 is a diagram illustrating another exemplary embodiment of a delay circuit used in a delay-locked loop according to the present invention.

FIGS. 4 and 5 illustrate two exemplary embodiments of a delay cell suitable for use with a delay-locked loop according to the present invention. These delay cells 46 and 48 may be used separately or in combination. Other delay cell designs suitable for use with the present invention will become apparent to one skilled in the art after reading the present application.

Figure 6A:
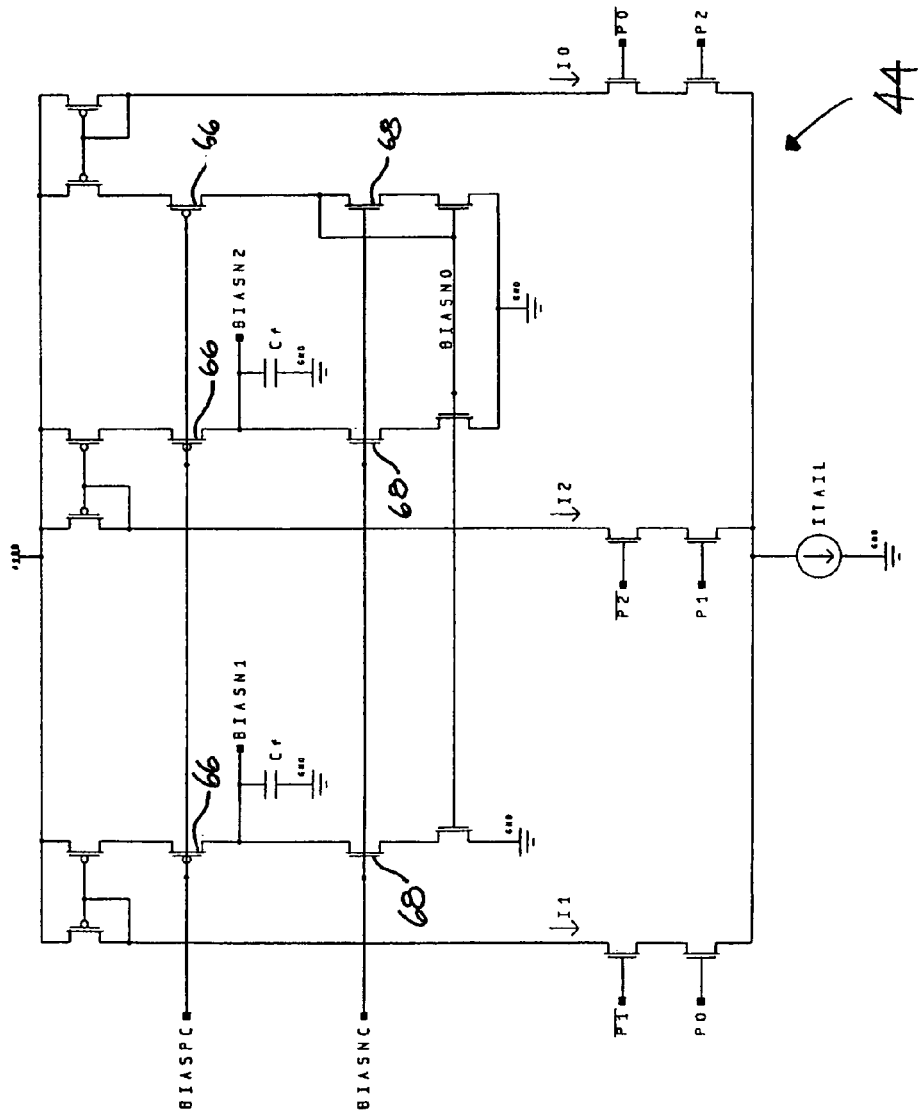
FIG. 6A is a diagram illustrating one exemplary embodiment of a feedback circuit used in a delay-locked loop according to the present invention.

FIG. 6A is a circuit diagram illustrating one exemplary embodiment of feedback circuit 44 used within a delay-locked loop according to the present invention. Feedback circuit 44 controls BIASN1 and BIASN2 such that the rising edge of the multiple clock phases generated by the delay line are equally spaced about 360 degrees.

At the delay-locked loop's stable operating point, the time-averaged currents $I_0=I_1=I_2$. When these currents are equal, then it follows that the time from the rising edge of P2 to the falling edge of P0 must be equal to both (a) the time from the rising edge of P0 to the falling edge of P1 and to (b) the time from the rising edge of P1 to the falling edge of P2. In addition, by including cascade transistors 66 and 68 connecting to BIASNC and BIASPC, systematic current mirror gain (which can result in phase errors in P[0:2]) is reduced. The voltage on BIASNC and BIASPC is nominally Vdd/2, but other voltages can be used with good results.

Figure 6B:
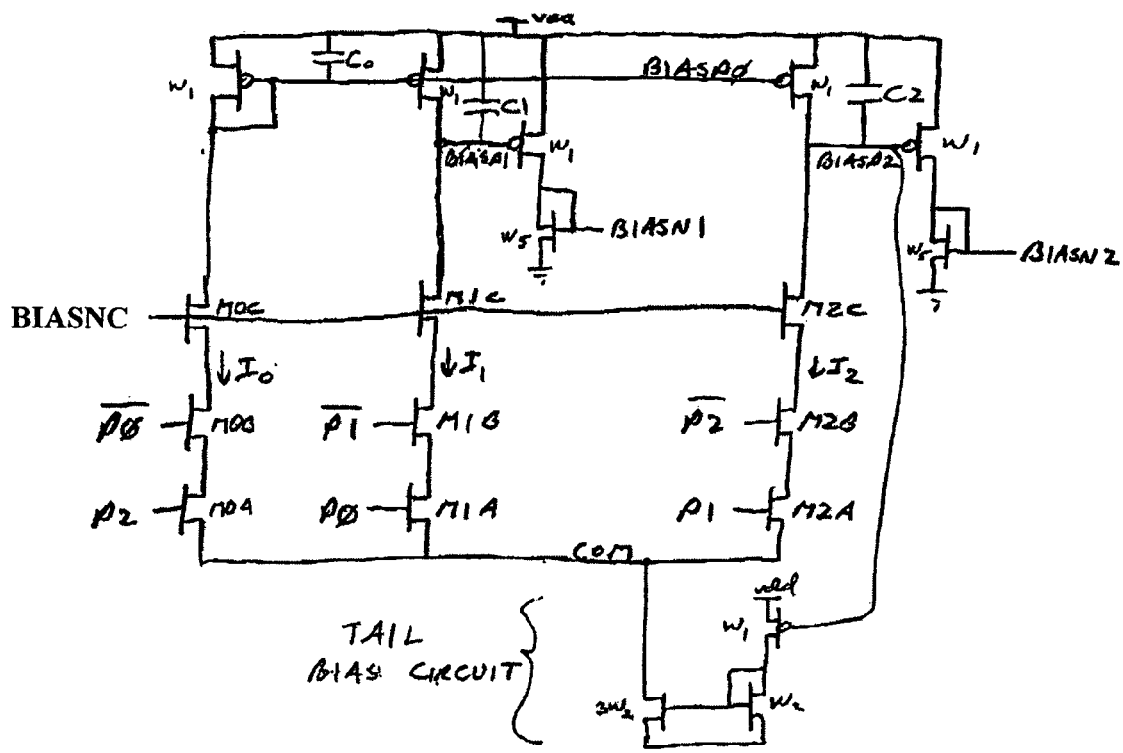
FIG. 6B is a diagram illustrating an alternate embodiment of a feedback circuit used in a delay-locked loop according to the present invention.

FIG. 6B is a circuit diagram illustrating an alternate embodiment of feedback circuit 44 used within a delay-locked loop according to the present invention. The use of multiple operational amplifiers with negative feedback provides additional current stabilization by eliminating the error created by the current mirrors.

Figure 6C:
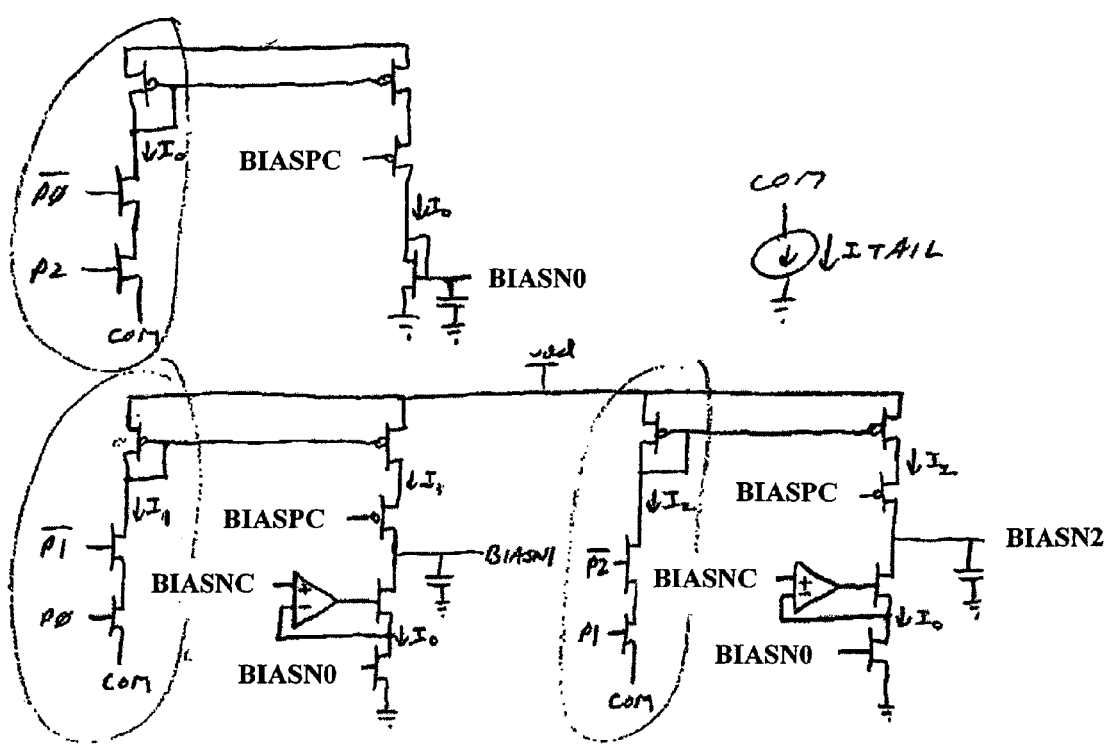
FIG. 6C is a diagram illustrating another alternate embodiment of a feedback circuit used in a delay-locked loop according to the present invention.

FIG. 6C is a circuit diagram illustrating another alternate embodiment of feedback circuit 44 used within a delay-locked loop according to the present invention. This feedback circuit includes one embodiment of a fixed tail bias circuit, and alternative capacitor locations.

Figure 7:
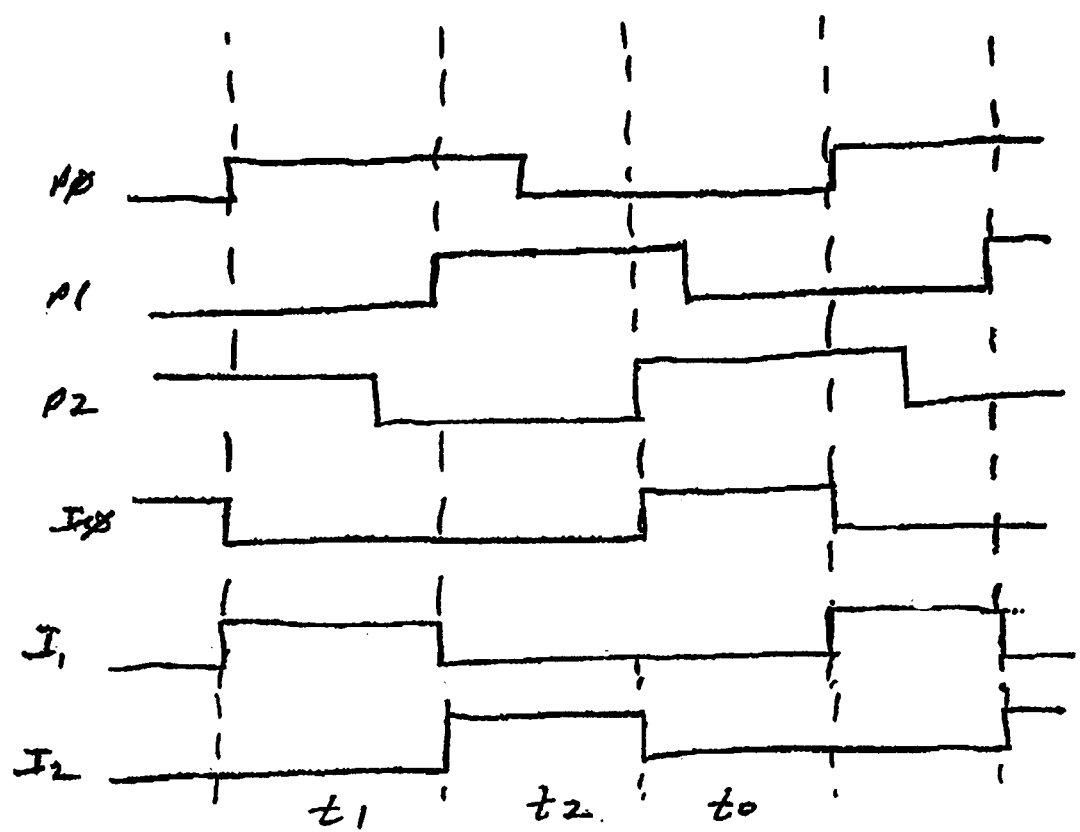
FIG. 7 is a timing diagram.

FIG. 7 illustrates one exemplary embodiment of a timing diagram, including P0, P1, P2, I0, I1 and I2.

Figure 8:
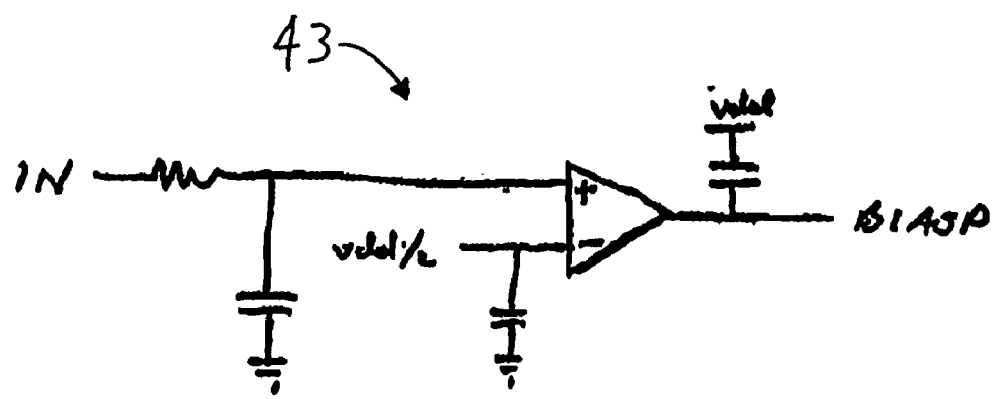
FIG. 8 is a diagram illustrating one exemplary embodiment of a duty cycle monitor.

FIG. 8 is a circuit diagram illustrating one exemplary embodiment of a duty cycle monitor 43. The duty-cycle monitor 43 is important in that it helps ensure that a 50% clock duty cycle is maintained through the delay line.

There are other circuits that can also be used to generate BIASN1 and BIASN2 from clocks P0, PI, and P2. Though this disclosure describes a delay locked loop generating 3 clock phases, similar circuits can be used to generate N clock phases as long as $N \geq 2:3$.

The present invention provides a single-ended delay-locked loop 40 where the delays from one rising edge to the next rising edge are controlled. All falling edges are controlled as a group (by means of controlling BIASP) such that the duty cycle of each clock is substantially 50%. The present invention provides a delay line where the time from each clock's rising edge to the next clock phase rising edge is converted to a current. A reference current is generated that is proportional to the time from the rising clock edge of the last clock phase in the delay line to the first clock phase in the delay line 42. A feedback control circuit then adjusts individual delay line element delays 46, or alternatively 48, until all of these currents (representing the spacing between rising edges of adjacent phases) are equal.

Figure 9:
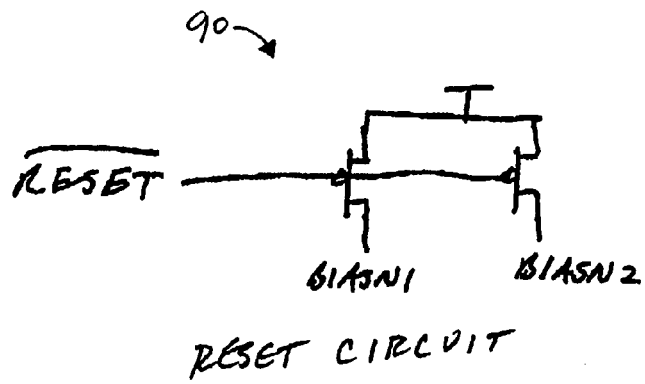
FIG. 9 is a diagram illustrating one exemplary embodiment of a reset circuit.

To help prevent a false-lock, a reset function can be used at start-up. FIG. 9 is a circuit diagram 90 illustrating one exemplary embodiment of a reset function suitable for use with the present invention. A circuit can be designed to detect a false-lock state and then momentarily apply reset (i.e., force RESET low).

Figure 10:
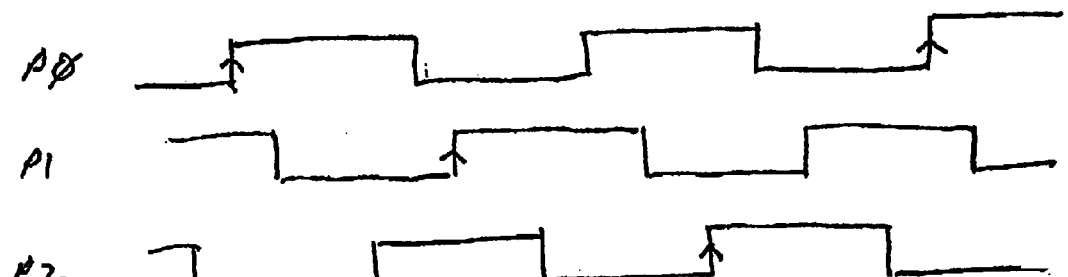
FIG. 10 is a timing diagram.

A false-lock condition occurs when the total delay in the delay line is some multiple of 360° where that multiple is an integer >1. In the exemplary timing diagram of FIG. 10, the clock phases P0, P1, P2 are evenly distributed about 720°, which is not desirable.

Figure 11:
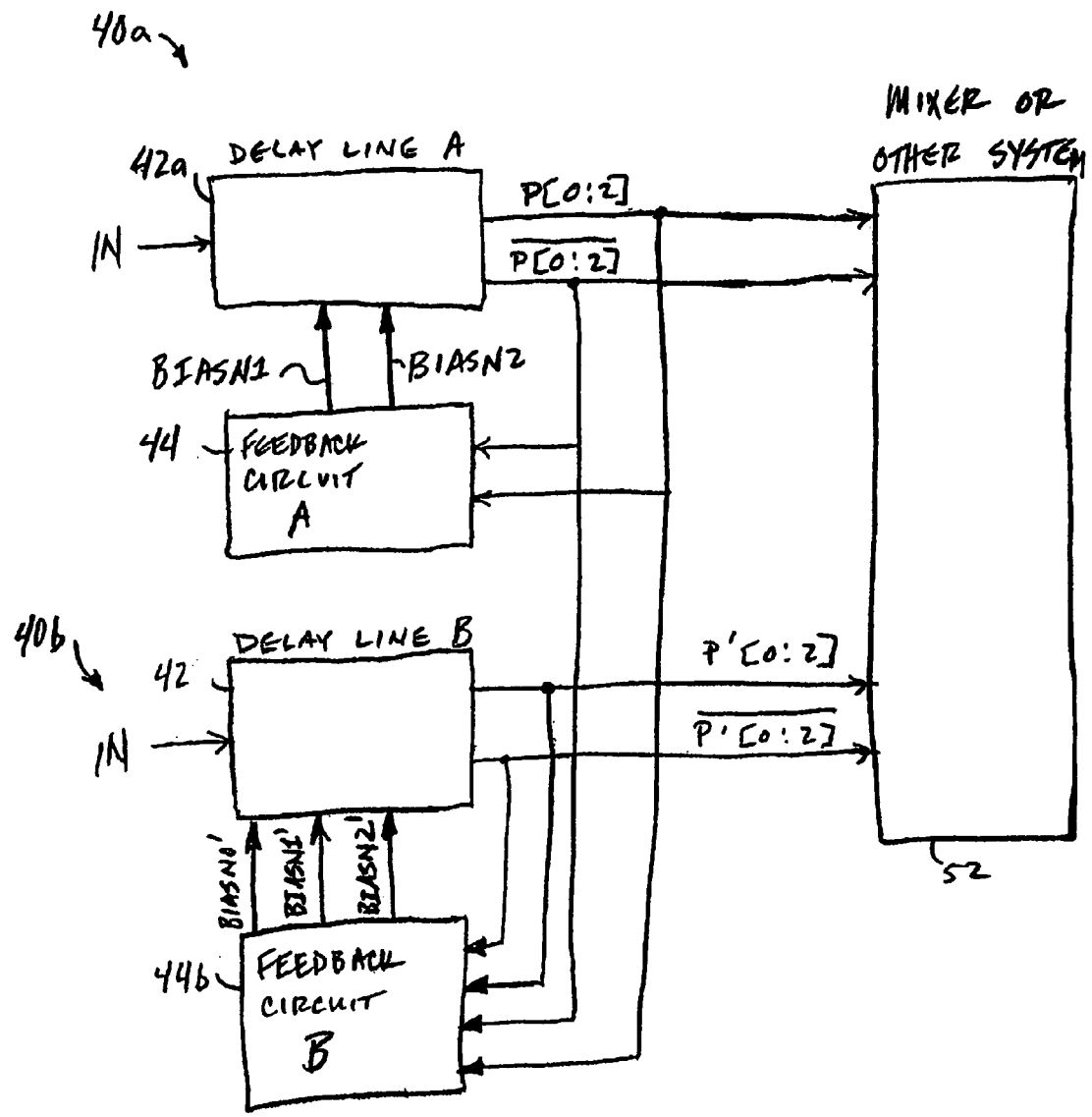
FIG. 11 is a diagram illustrating a second exemplary embodiment of a delay-locked loop according to the present invention where multiple delay-locked loops are coupled together to achieve clock phase multiplication.
Figure 12:
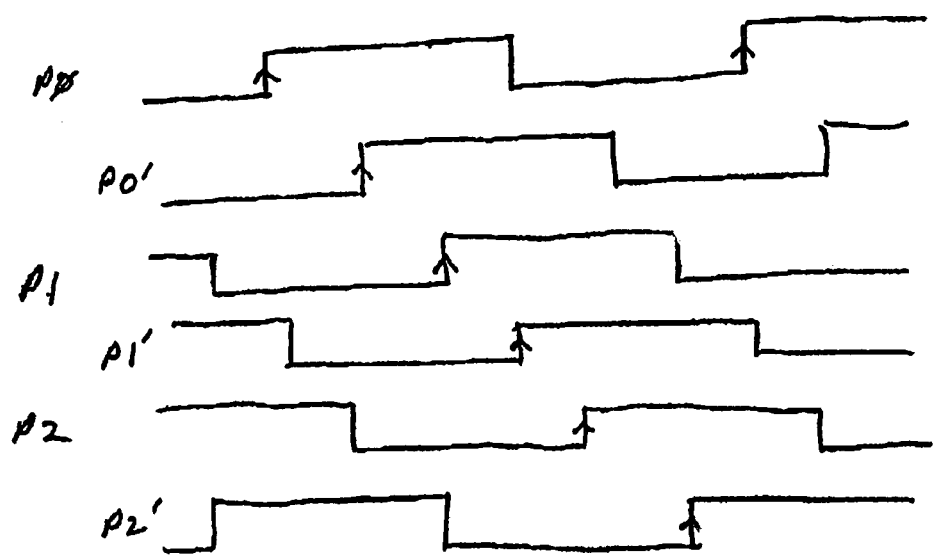
FIG. 12 is a timing diagram.

FIGS. 11 and 12 are diagrams illustrating a second exemplary embodiment of a delay-locked loop for generating multiple clock phases evenly spaced about 360° according to the present invention. In one aspect illustrated, clock phase multiplication is achieved with multiple delay-locked loops 40a and 40b coupled together where the spacing between generated clock phases is less than the delay through a single delay element within each delay-locked loop. The present invention overcomes the problem where the minimum clock phase spacing that you could achieve was limited to the minimum delay-element delay. A first delay-locked loop 40a is constructed as previously described herein under the heading "DELAY-LOCKEDLOOP". A second delay-locked loop 40b is coupled to the first delay-locked loop such that the rising edges of its three clock phases lie exactly distributed between the rising edges of the first delay-locked loop's clock phases, illustrated generally in the timing diagram of FIG. 12.

Figure 13:
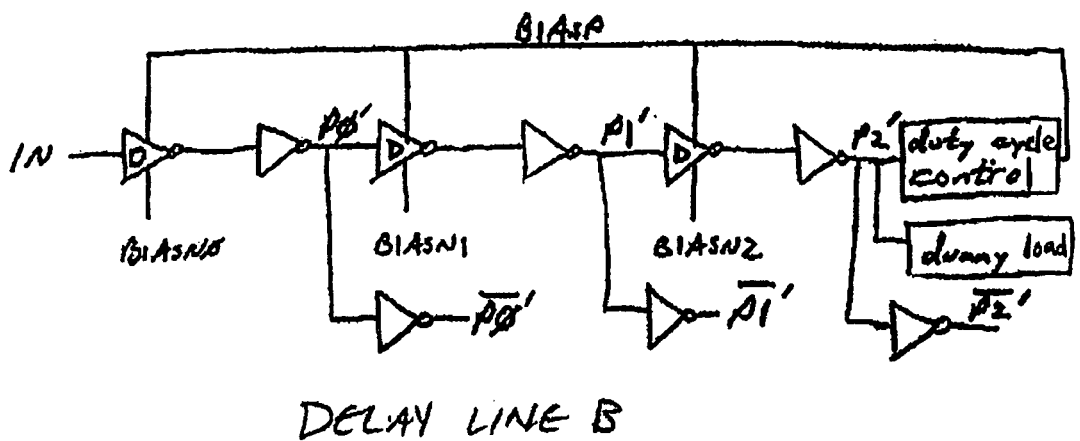
FIG. 13 is a diagram illustrating a second delay line B suitable for use in the delay-locked loop illustrated in FIG. 12.
Figure 14:
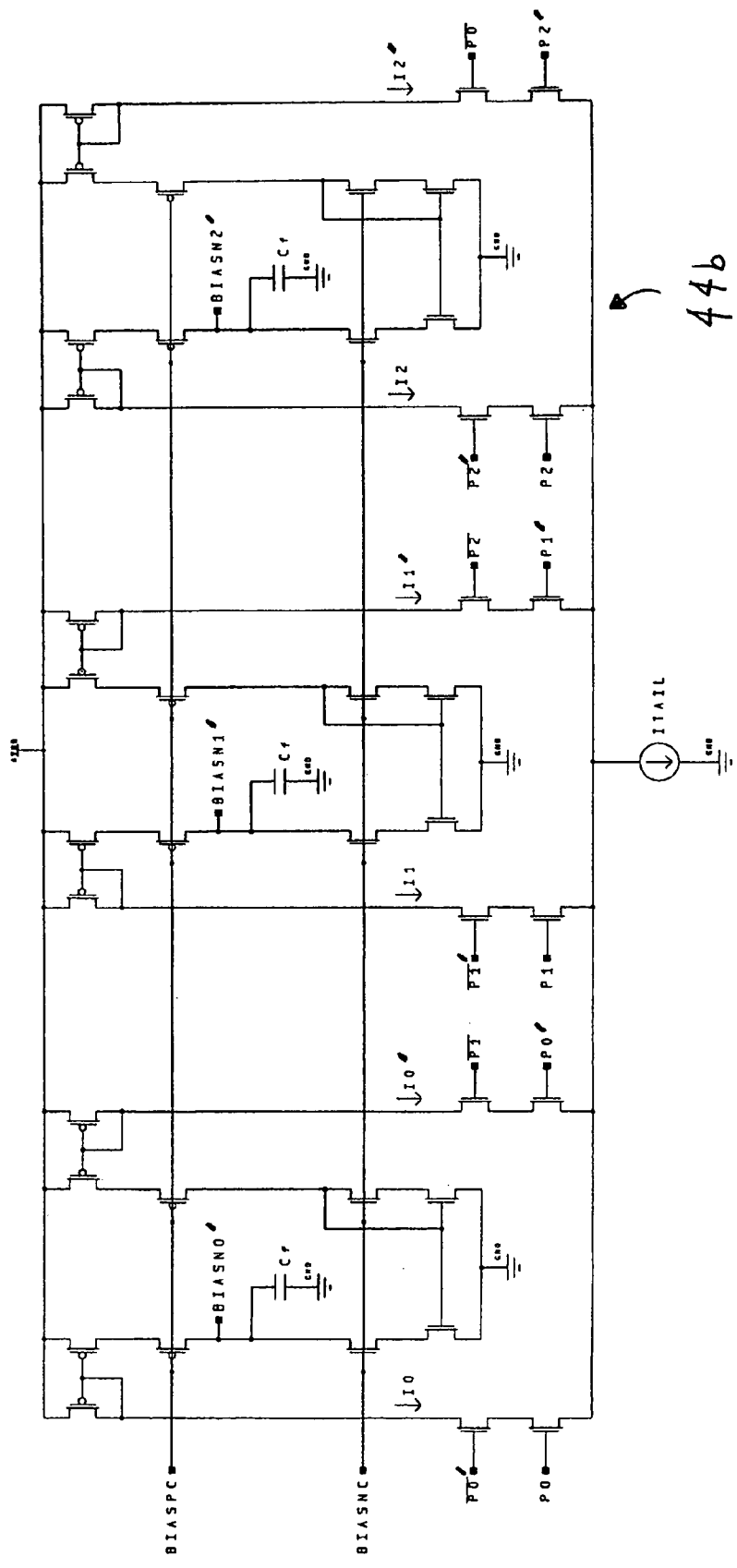
FIG. 14 is a diagram illustrating one exemplary embodiment of feedback circuit suitable for use with a second delay line according to the present invention.

FIG. 13 is a diagram illustrating one exemplary embodiment of the second delay line 42b used in a coupled delay-locked loop according to the present invention. FIG. 14 is a diagram illustrating one exemplary embodiment of feedback circuit 44b for the second delay line 42b used in coupled-delay locked loop 40a. A control circuit converts the time delay from the rising edge of P0 to the falling edge of P0' to a first current and the rising edge of P0' to the falling edge of P1 to a second current. A comparison circuit continuously compares the value of the first current to the value of the second current. When the first current is greater than the second current, the voltage on BIAS N0' increases, advancing the P0' rising edge in time, thereby reducing the first current and increasing the second current. This feedback circuit will settle into a state with the first current equal to the second current, and thus with the rising edge of P0' mid-point between (in time) the rising edges of P0 and P1, as desired. In a similar fashion, the rising edge of P1' is adjusted until mid-point between the rising edges of P1 and P2, and the rising edge of P2' is adjusted until mid-point between the rising edges of P2 and P0.

Figure 15:
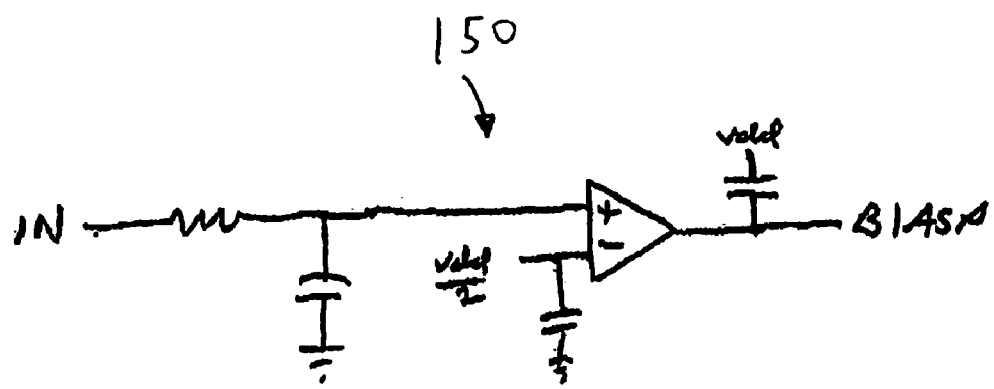
FIG. 15 is a diagram illustrating one exemplary embodiment of a duty cycle monitor.

FIG. 15 illustrates one exemplary embodiment of a duty cycle control circuit 150. The duty cycle control circuit 150 monitors the duty cycle of P2' and controls BIASP (and the timing of the falling edge of P0',P1',and P2') such that the duty cycle of P2' (and, by extension, the duty cycle of P0' and P1') is substantially 50%.

Though this disclosure describes two coupled delay-locked-loops each generating 3 phases (for a total of 6 clock phases), similar circuits can be used to generate a total of 2N clock phases for any N≧3.

Figure 16:
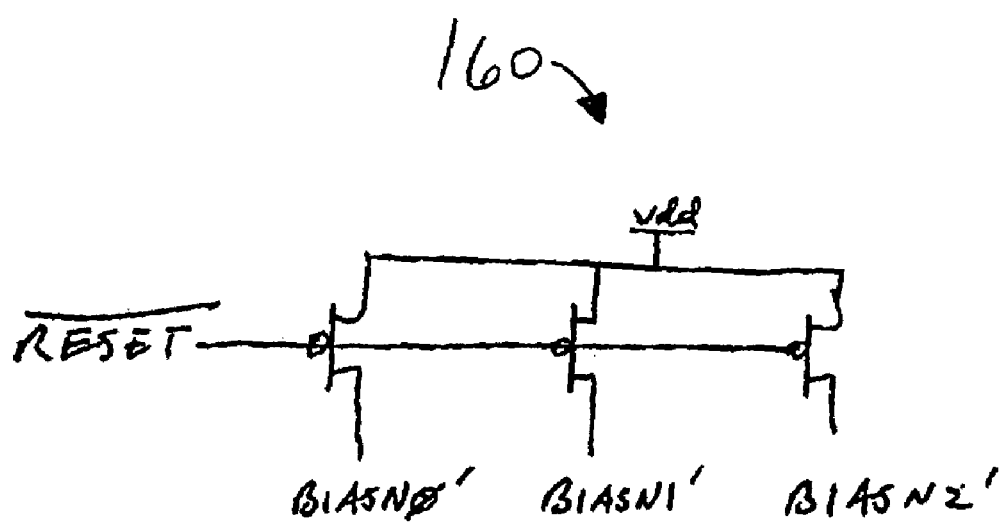
FIG. 16 is a diagram illustrating one exemplary embodiment of a reset circuit.

FIG. 16 is a circuit diagram illustrating one exemplary embodiment of a reset circuit 160 suitable for use with the present invention. A reset function is needed at startup.

One of the advantages of this circuit 40a is that it offers the ability to halve the spacing "in time" of the generated clocks while each of the two coupled delay lines operating frequency and stage delay remain unchanged. By contrast, an attempt to get a single delay line to generate twice as many phases while operating at the same frequency would require that the number of delay stages in the delay line be doubled and the delay through each delay stage would be halved. For a delay line already operating close to its speed limit, this is not possible.

Also, similar techniques and circuits can be used to couple more than two delay-locked loops. Furthermore, the various alternate embodiments of feedback circuit 44, including 44a, 44b, 44c and others, could be incorporated into circuit 40a.

Figure 17:
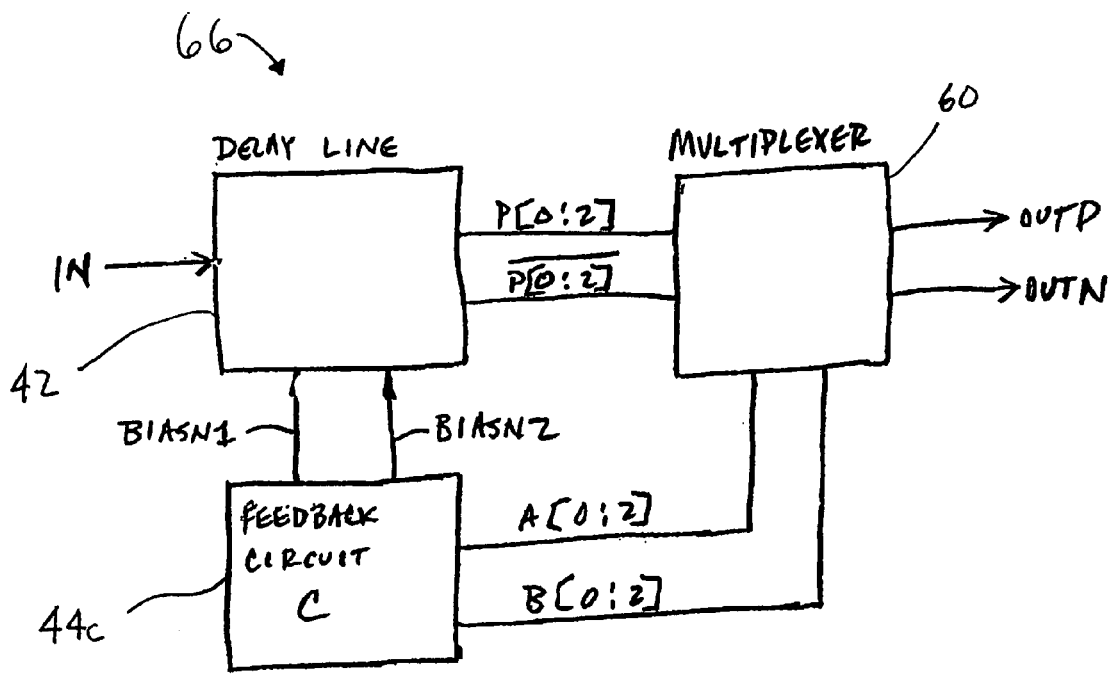
FIG. 17 is a diagram illustrating a third exemplary embodiment of a delay locked loop where a time division multiplexer is embedded within the delay-locked loop according to the present invention.

FIG. 17 illustrates a third exemplary embodiment of the present invention consisting of a delay-locked loop 66 and time-division multiplexer 60, where a portion of the multiplexer is embedded within the control loop of the delay-locked loop. The clocks generated by the delay-locked loop can be used to control a time-division multiplexer 60. To reduce timing errors that can be introduced in such a circuit because of mismatched parallel signal paths through the multiplexer, the delaylocked loop's feedback loop is expanded to include key components of the time division multiplexer 60.

Figure 18:
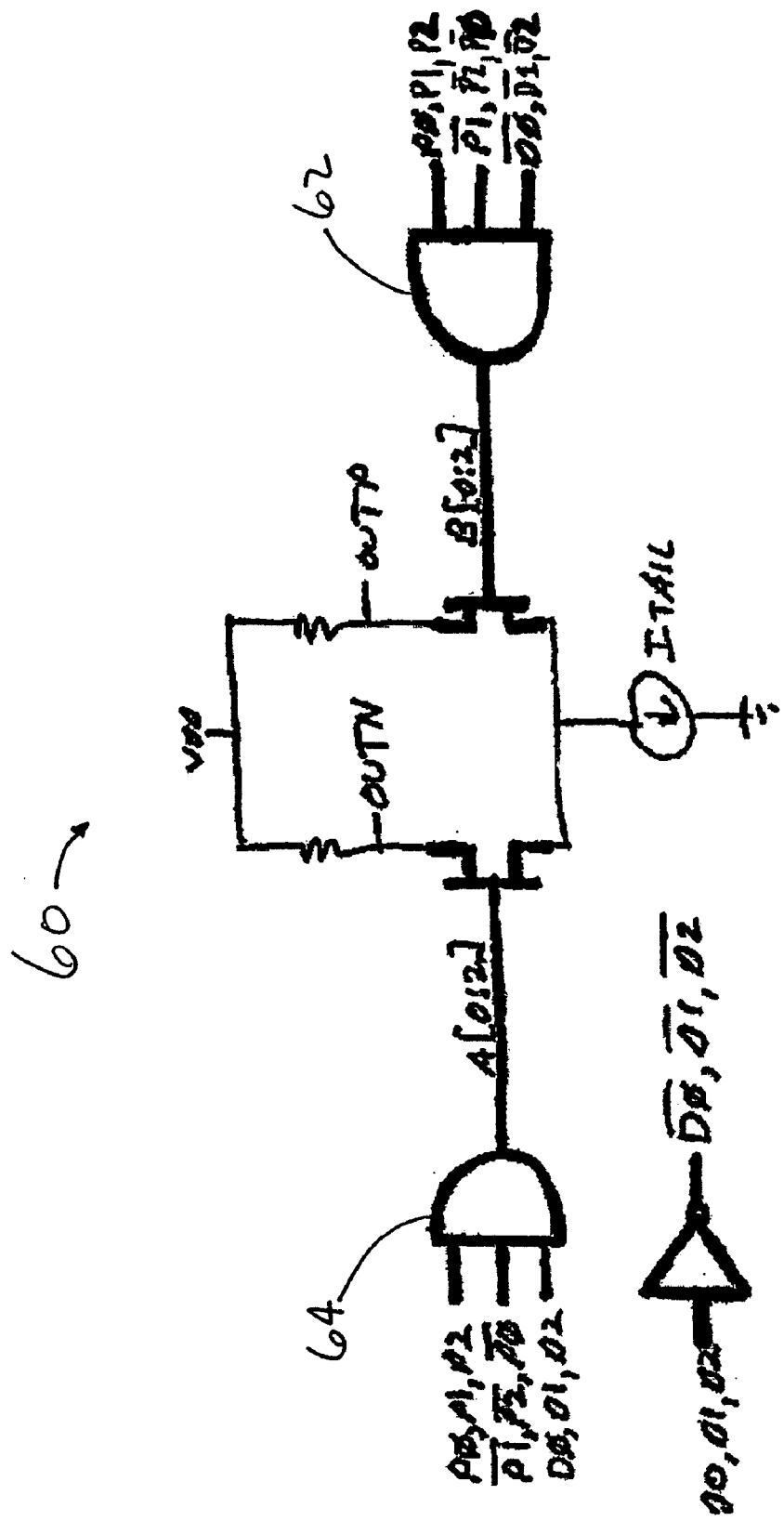
FIG. 18 is a diagram illustrating one exemplary embodiment of a time division multiplexer used with a delay-locked loop according to the present invention.

FIG. 18 illustrates one exemplary embodiment of an embedded time division multiplexer according to the present invention. The circuit begins with the delay line illustrated in FIG. 19. The clock phases P[0:2] and P[0:2] are then used to control the time-division multiplexer.

In reference to FIG. 18, the darkened lines indicate buses, and the darkened circuit elements indicate arrays of elements. In any given "bit-time" (defined here as that period of time between the rising edge of $P_N$ and the falling edge of $P_{N+1}$) either $A_N$ or $B_N$ will pulse high (depending on the state of $D_N$) while all the other Ax and Bx (x≠n) remain low. The AND gates 62 and 64 can be straightforward CMOS-logic implementations or can be more elaborate constructions.

Figure 19:
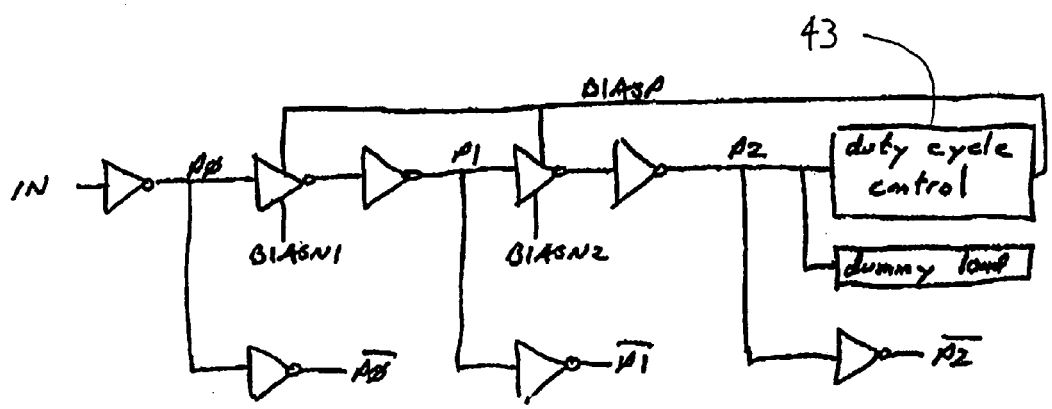
FIG. 19 is a diagram illustrating one exemplary embodiment of a delay line used in a delay-locked loop according to the present invention.

In reference also to FIG. 19, BIASN1 and BIASN2 are controlled such that the pulses on nets A[0:2] and B[0:2] in FIG. 18 are all the same width. The "duty-cycle control" circuit 43 controls BIASP such that the duty cycle at P2 (and, by extension, at P0 and P1) is substantially equal to 50%.

Figure 20:
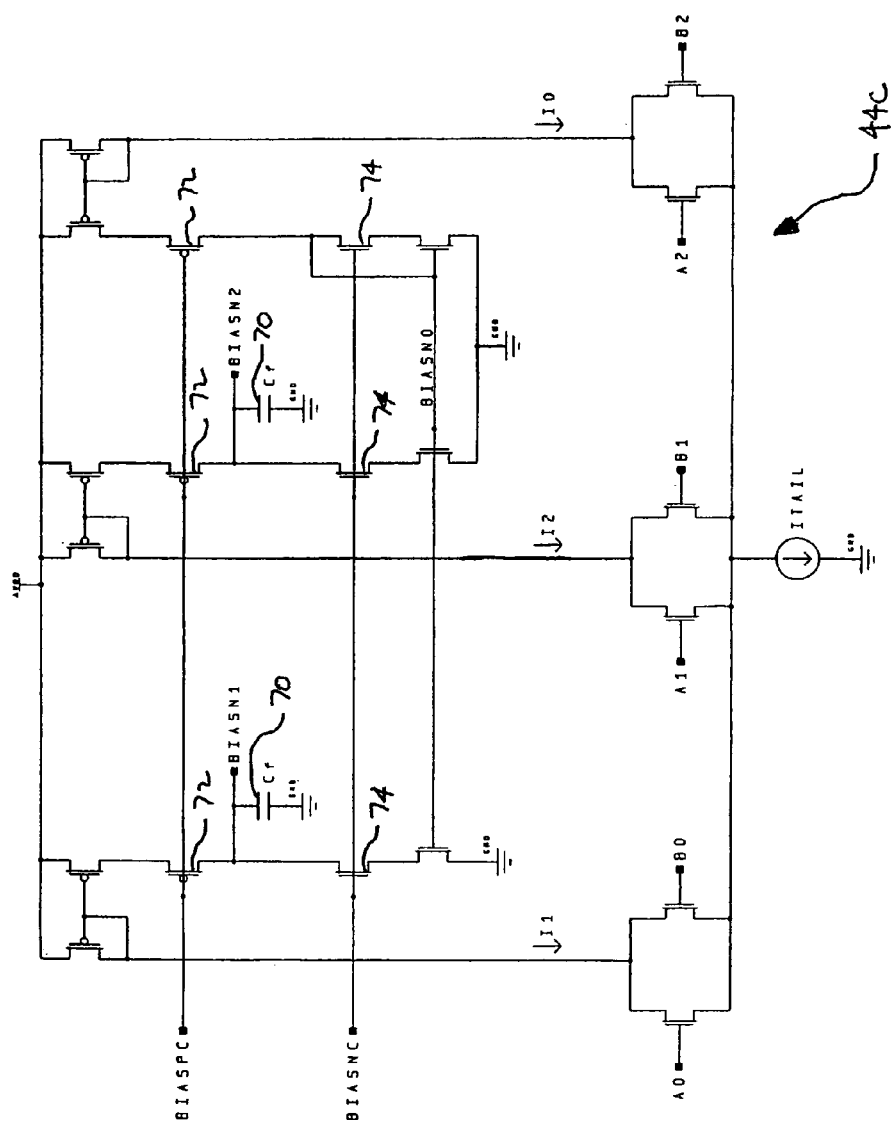
FIG. 20 is a diagram illustrating one exemplary embodiment of a feedback circuit used in a delay-locked loop according to the present invention.

FIG. 20 is a circuit diagram 44c illustrating one exemplary embodiment of feedback circuit C according to the present invention. The loop dominant pole is set by $C_F$ 70. Other methods of compensation are possible. This feedback circuit's stable operating point is when the time-averaged currents $I_0$, $I_1$ and $I_2$ are all equal. When equal, this means that the signal pulse-widths on AN and BN (N=0, 1, 2) are all equal. This is the desired condition. By including cascade transistors 72 and 74 connecting to BIASNC and BIASPC, systematic current mirror gain (which can result in phase errors in P[0:2]) is reduced. The voltage on BIASNC and BIASPC is nominally Vdd/2, but other voltages can be used with good results. It will be apparent to one skilled in the art after reading the present application that circuits other than that shown in FIG. 20 can be used to accomplish substantially the same function.

Figure 21:
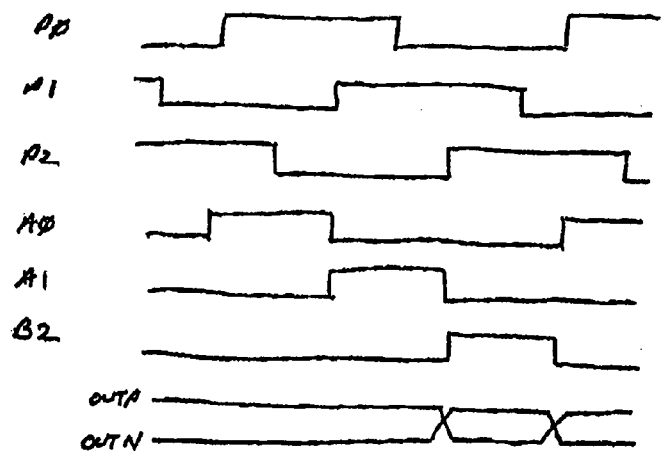
FIG. 21 is a timing diagram.

The present invention provides a single-ended delay-locked loop 66, controlling a time-division multiplexer 60, where the pulses internal to that multiplexer 60 are used to control the delay-locked loop. "Lock" is achieved (i.e. the feedback loop reaches its stable operating point) when all of the multiplexer's control pulses (A[0:2] and B[0:2]) are the same width. When the loop is "in lock", the timing diagram illustrated in FIG. 21 applies.

Figure 22:
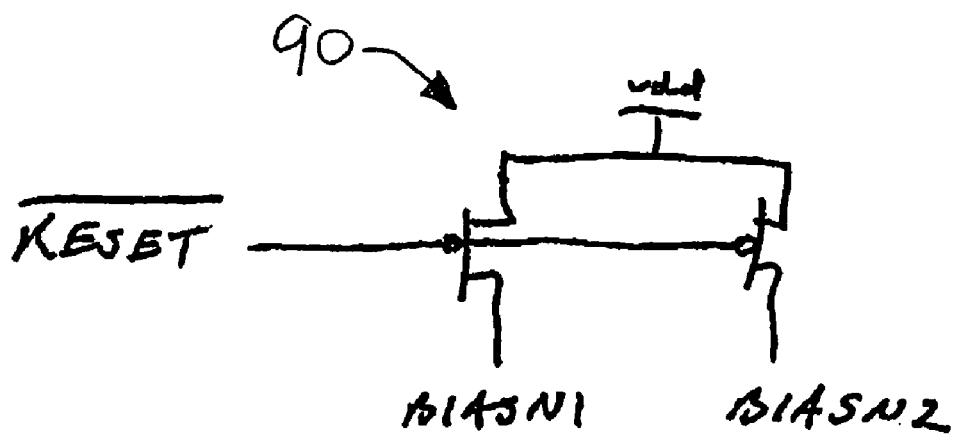
FIG. 22 is a diagram illustrating one exemplary embodiment of a reset circuit used with a delay-locked loop according to the present invention.

To prevent a false-lock, a RESET function is applied at startup. One exemplary embodiment of a reset circuit 90 suitable for use with the present invention is illustrated in FIG. 22.

Though this disclosure describes a delay-locked loop generating 3 phases and controlling a 3:1 time-division multiplexer, similar circuits can be used to create an N-phase DLL controlling an N:1 time-division multiplexer as long as N≧3.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein.

What is claimed is:

1. A delay locked loop (DLL) circuit comprising:
a delay line comprising serially connected first and second delay elements with said second delay element serially connected to a duty cycle monitor, wherein each delay element is adapted to receive at least a clock input signal and output at least a clock output signal with a phase offset from said clock input signal, the delay line configured so that at least one clock input signal is a reference input clock signal and at least one clock output signal is a delay-line output clock signal; and
a feedback circuit configured to generate delay adjust signals based upon said phase offsets between at least one pair of signals selected from a set containing said reference input clock signal and said clock output signals, said delay adjust signals being fed back to at least one of said plurality of delay elements to cause said reference input clock signal to said plurality of clock output signals to be progressively phase-shifted apart equally about 360 degrees.

2. A delay locked loop (DLL) circuit comprising:
a delay line including serially connected first and second delay elements with said second delay element serially connected to a duty cycle monitor, wherein each delay element is adapted to receive at least a clock input signal and output at least a clock output signal with a phase offset from said clock input signal, the delay line configured so that at least one clock input signal is a reference input clock signal and at least one clock output signal is a delay-line output clock signal; wherein the first delay element is configured to take a reference clock input signal and output a first clock output signal delayed by a first time delay; the second delay element configured to take the first clock output signal and output a second clock output signal delayed by a second time delay; and the duty cycle monitor adapted to receive the second clock output signal and output a duty cycle corrected signal by correcting a duty of the second clock output signal, said duty cycle output corrected signal being fed back to each of said first clock output signal and said second clock output signal; and
a feedback circuit configured to generate delay adjust signals based upon said phase offsets between at least one pair of signals selected from a set containing said reference input clock signal and said clock output signals, said delay adjust signals being fed back to at least one of said plurality of delay elements to cause said reference input clock signal to said plurality of clock output signals to be progressively phase-shifted apart equally about 360 degrees wherein said feedback circuit is further configured to generate a reference current corresponding to the phase shift between the reference clock input signal and the second clock output signal, a first phase shift current corresponding to phase shift between the input reference clock and the first clock output signal, and a second phase shift current corresponding to the phase shift between the first and second output clock signal, the feedback circuit adapted to output a first and second delay adjust signals based upon differences between the phase shift currents and the reference current, said first delay adjust signal being fed back to said first delay element and said second delay adjust signal being fed back to said second delay element causing said reference clock input signal, said first clock output signal and said second clock output signal to be progressively phase-shifted apart equally about 360 degrees.

3. A delay locked loop (DLL) circuit comprising:
a delay line including a plurality of delay elements wherein each delay element is adapted to receive at least a clock input signal and output at least a clock output signal with a phase offset from said clock input signal, the delay line configured so that at least one clock input signal is a reference input clock signal and at least one clock output signal is a delay-line output clock signal; and
a feedback circuit configured to generate delay adjust signals based upon said phase offsets between at least one pair of signals selected from a set containing said reference input clock signal and said clock output signals, said delay adjust signals being fed back to at least one of said plurality of delay elements to cause said reference input clock signal and said plurality of clock output signals to be progressively phase-shifted apart equally about 360 degrees; wherein the feedback circuit includes:
a first pair of cross-coupled transistors forming a first current mirror, said first pair of cross-coupled transistors having a first and a second current mirror transistor, and a first set of three series-connected reference transistors, each having a reference bias voltage input, said first set of series connected reference transistors being connected to the first current mirror transistor; and a first pair of signals selected from the set containing said reference input clock signal and said clock output signals, said first pair of signals input to a pair of series connected transistors connected to said second current mirror transistor to generate a first reference current and a first delay signal;
a second pair of cross-coupled transistors forming a second current mirror, said second pair of cross-coupled transistors having a first and a second current mirror transistor, and a set of three series-connected reference transistors, each having a reference bias voltage input, said set of series connected reference transistors being connected to the first current mirror transistor; and a second pair of signals selected from the set containing said reference input clock signal and said clock output signals, said second pair of signals input to a pair of series connected transistors connected to said second current minor transistor to generate a second reference current and a second delay signal;
a third pair of cross-coupled transistors forming a third current minor, said third pair of cross-coupled transistors having a first and a second current mirror transistor, and a set of three series-connected reference transistors, each having a reference bias voltage input, said set of series connected reference transistors being connected to the first current mirror transistor; and a third pair of signals selected from the set containing said reference input clock signal and said clock output signals, said third pair of signals input to a pair of series connected transistors connected to said second current mirror transistor to generate a third reference current; and
a tail bias circuit summing the reference currents;
such that said feedback circuit stabilizes when said reference currents become substantially equal.

4. A delay locked loop (DLL) circuit comprising:
a delay line including serially connected first and second delay elements with said second delay element serially connected to a duty cycle monitor, wherein each delay element is adapted to receive at least a clock input signal and output at least a clock output signal with a phase offset from said clock input signal, the delay line configured so that at least one clock input signal is a reference input clock signal and at least one clock output signal is a delay-line output clock signal;

a feedback circuit configured to generate delay adjust signals based upon said phase offsets between at least one pair of signals selected from a set containing said reference input clock signal and said clock output signals, said delay adjust signals being fed back to at least one of said plurality of delay elements to cause said reference input clock signal to said plurality of clock output signals to be progressively phase-shifted apart equally about 360 degrees wherein the first delay element is configured to take a reference clock input signal and output a first clock output signal delayed by a first time delay; the second delay element configured to take the first clock output signal and output a second clock output signal delayed by a second time delay; and the duty cycle monitor adapted to receive the second clock output signal and output a duty cycle corrected signal by correcting a duty of the second clock output signal, said duty cycle output corrected signal being fed back to each of said first clock output signal and said second clock output signal, the feedback circuit further including a portion of a time-division multiplexer embedded within the feedback circuit wherein the time-division multiplexer is configured to receive the reference clock input signal, the first and second clock output signals and an incoming data stream, to sample the incoming data stream with the clock signals, and to generate a first and a second set of multiplexer output signals, wherein the output signals correspond to the first set of multiplexer output signals being the inverse of the second, and each multiplexer output signal having a corresponding pulse width, wherein the feedback circuit is adapted to receive the multiplexer output signals, measure the pulse width of each multiplexer output signal and to output a first and second delay adjust signal for feeding back to a first and a second delay element to cause the pulse widths to be substantially equal; and wherein said feedback circuit is further configured to generate a reference current corresponding to the phase shift between the reference clock input signal and the second clock output signal, a first phase shift current corresponding to phase shift between the input reference clock and the first clock output signal, and a second phase shift current corresponding to the phase shift between the first and second output clock signal, the feedback circuit adapted to output a first and second delay adjust signals based upon differences between the phase shift currents and the reference current, said first delay adjust signal being fed back to said first delay element and said second delay adjust signal being fed back to said second delay element causing said reference clock input signal, said first clock output signal and said second clock output signal to be progressively phase-shifted apart equally about 360 degrees.

5. The delay-locked loop of claim 4 wherein the first set of multiplexer output signals comprises a first, second, and third multiplexer output, wherein each of a first set of multiplexer output signals comprises a combination of the incoming data stream, a clock output signal, and a clock output signal or reference clock input signal, and each of the multiplexer outputs has a corresponding pulse width such that a sum of the pulse widths of all outputs in the set substantially equals a period of the reference clock, and a second set of multiplexer output signals comprises a first, second, and third multiplexer output, wherein the first, second, and third multiplexer outputs of the second set of multiplexer output signals are substantially inversions of the multiplexer outputs of the first set of multiplexer output signals, respectively.

6. The delay-locked loop of claim 5 wherein the feedback circuit is further adapted to generate a pulse width reference current corresponding to the pulse width of the first multiplexer output of either the first or second set of multiplexer output signals, a first pulse width current corresponding to the pulse width of the second multiplexer output of either the first or second set of multiplexer output signals, and a second pulse width current corresponding to the pulse width of the third multiplexer output of either the first or second set of multiplexer output signals, the feedback circuit adapted to output a first and second delay adjust signals based upon differences between the pulse width currents and the pulse width reference current, said first delay adjust signal being fed back to said first delay element and said second delay adjust signal being fed back to said second delay element causing the pulse widths of all the multiplexer outputs to be substantially equal.

7. A delay locked-loop system comprising:
at least two delay-locked loops coupled together, generating multiple clock phase outputs equally spaced about 360 degrees, such that the spacing between generated clock phases is less than the delay through a single delay element in a delay-locked loop;
wherein a first delay-locked loop comprising a delay line generates a first set of clock phase outputs equally spaced about 360 degrees; and a feedback loop including a feedback circuit which measures the set of clock phase outputs and provides an adjusted control output signal for each clock phase to the delay line such that the set of clock phase outputs are equally spaced about 360 degrees; and
a second delay-locked loop coupled to the first delay-locked loop such that the rising edges of its second set of clock phases lie substantially halfway between the rising edges of the first delay-locked loop's first set of clock phases.

8. A method for producing a set of synchronized clock signals, the method comprising the steps of:
generating a plurality of phase-shifted clock outputs from a delay line including at least two adjustable delay elements and a duty cycle monitor communicatively coupled to each other, whereby each adjustable delay element in conjunction with the duty cycle monitor accepts an input clock signal concurrently with a delay adjust signal and generates the phase-shifted clock output; and
adjusting the phases of the phase-shifted clock outputs by measuring each phase-shift with a feedback circuit and generating a delay-adjust signal for each clock phase to the delay line such that the plurality of phase-shifted clock outputs are equally spaced substantially about 360 degrees.

9. A delay locked loop (DLL) circuit comprising:
a means for generating a plurality of phase-shifted clock outputs from a delay line that includes at least two adjustable delay elements and a duty cycle monitor communicatively coupled to each other, whereby each adjustable delay element in conjunction with the duty cycle monitor includes a means for accepting an input clock signal concurrently with a delay adjust signal and a means for generating the phase-shifted clock output; and a means for adjusting the phases of the phase-shifted clock outputs by measuring each phase-shift with a feedback circuit and generating a delay-adjust signal for each clock phase to the delay line such that the plurality of phase-shifted clock outputs are equally spaced substantially about 360 degrees.

* * * * *